United States Patent
Corbo et al.

(10) Patent No.: US 10,516,254 B2
(45) Date of Patent: Dec. 24, 2019

(54) ELECTRONICS RACK WITH INTEGRATED BATTERIES FOR UNINTERRUPTED POWER SUPPLY

(71) Applicant: Middle Atlantic Products, Inc., Fairfield, NJ (US)

(72) Inventors: Nico Corbo, Blairstown, NJ (US); Brendan K. Walsh, Belvidere, NJ (US)

(73) Assignee: Legrand AV Inc., Fairfield, NJ (US)

( * ) Notice: Subject to any disclaimer, the term of this patent is extended or adjusted under 35 U.S.C. 154(b) by 0 days.

(21) Appl. No.: 15/987,546

(22) Filed: May 23, 2018

(65) Prior Publication Data
US 2018/0358789 A1   Dec. 13, 2018

Related U.S. Application Data

(60) Provisional application No. 62/516,990, filed on Jun. 8, 2017.

(51) Int. Cl.
| | |
|---|---|
| *H02B 1/36* | (2006.01) |
| *H01M 2/10* | (2006.01) |
| *H05K 7/14* | (2006.01) |
| *H01R 41/00* | (2006.01) |
| *H02B 1/20* | (2006.01) |
| *H02J 9/06* | (2006.01) |

(52) U.S. Cl.
CPC ............ *H02B 1/36* (2013.01); *H01M 2/1077* (2013.01); *H01R 41/00* (2013.01); *H02B 1/20* (2013.01); *H05K 7/1492* (2013.01); *H01M 2220/10* (2013.01); *H02J 9/06* (2013.01)

(58) Field of Classification Search
CPC ... H02B 1/20; H02B 1/36; H05K 7/14; H01R 41/00; H02J 9/06; H01M 2/1072; H01M 2220/10
USPC .................................................. 361/600–678
See application file for complete search history.

(56) References Cited

U.S. PATENT DOCUMENTS

| | | | | |
|---|---|---|---|---|
| 5,829,130 A | * | 11/1998 | Miller ....................... | G06F 1/16 29/868 |
| 7,719,835 B1 | | 5/2010 | Schluter | |
| 9,030,810 B2 | * | 5/2015 | Ehlen ................... | H05K 7/1432 361/622 |
| 9,301,605 B2 | * | 4/2016 | Corbo .................. | A47B 47/027 |
| 2010/0187908 A1 | * | 7/2010 | Okano ....................... | G06F 1/30 307/64 |
| 2017/0373528 A1 | * | 12/2017 | Davis ........................ | H02J 9/06 |

* cited by examiner

*Primary Examiner* — Zachary Pape
(74) *Attorney, Agent, or Firm* — Drinker Biddle & Reath LLP

(57) ABSTRACT

An electronics rack with integrated battery storage compartment for an uninterrupted power supply is disclosed. The battery storage compartment includes a compartment housing attached to the rack and a compartment drawer slidingly mounted within the compartment housing. The compartment drawer includes an uninterrupted power supply (UPS) and one or more batteries for providing battery powered backup for electronics components mounted in the rack. The UPS includes one or more output power lines that connect to one or more outlets for supplying power to components mounted on the rack. The compartment drawer is mounted to the compartment housing through mating slide rails. The compartment drawer includes an access panel with a handle which permits a user to slide the compartment drawer out from the compartment housing.

15 Claims, 3 Drawing Sheets

ELECTRONICS RACK WITH INTEGRATED BATTERIES FOR UNINTERRUPTED POWER SUPPLY

RELATED APPLICATION

This application is related to and claims priority from U.S. Provisional Application 62/516,990, filed Jun. 8, 2017, the disclosure of which is incorporated herein in its entirety.

BACKGROUND

Racks for holding electronics, such as computer servers, processors, and storage banks are used in a variety of businesses and locations, including in data centers. Such racks are made from metal, such as steel, and designed to provide a strong, secure structure for containing and protecting the electronics from unauthorized access, inadvertent contact and adverse environmental conditions, while at the same time providing access for servicing.

Most frame assemblies include a top shelf, a base, and four or more vertical support rails that are screwed or attached to the top and base through the use of screws and multiple components. One improved, quick assembly rack is disclosed in U.S. Pat. No. 9,155,383, the disclosure of which is incorporated herein by reference in its entirety.

The power to the electronic components contained within the rack is generally provided by one or more power supplies or power distribution units, such as power strips, that are mounted within or on the outside of the rack. The electronic components are plugged into these PDUs or power strips thereby making movement or servicing of the rack or electronics component more convenient. However, it is important to maintain continuous power to the rack and its components, except during servicing, including during power outages. To date many racks have an external uninterrupted power supply (UPS) mounted nearby that includes battery backups which provide continuous power to the rack for a period of time, when the direct power source is lost, such as during a power outage. The problem with use of a separate UPS is that when the rack is being services and the direct power is being turned off, the UPS must also be turned off to prevent inadvertent shock to the service personnel. Also, the batteries in the UPS must periodically be replaced.

U.S. Pat. No. 7,719,835 discloses a wiring and power distribution device for use in a cabinet housing electronic equipment. The distribution device includes a plurality of compartments, with each compartment adapted to contain an electronic component, such as an uninterruptible power supply, a power-conditioning device, or a power distribution center containing circuit breakers. The distribution device provides a single input point for power and signal wiring, and at least one output point for connection to the electronic devices contained within the cabinet. Access to the compartments is provided either by removing the bottom panel and accessing through the top of the rack or removing knock-out plugs. The disclosure of U.S. Pat. No. 7,719,835 is incorporated herein by reference in its entirety.

While U.S. Pat. No. 7,719,835 provides an advance over prior power supplies, access to the components could be improved. A need, therefore, exists for an electronics rack that provides a centralized uninterrupted power supply with easy access.

SUMMARY OF THE INVENTION

An electronics rack with integrated battery storage compartment for an uninterrupted power supply is disclosed. The rack includes a base frame, a top frame, at least four vertical posts, each end of each vertical post attaching to the top frame and base frame. A battery storage compartment includes a compartment housing attached to the rack and a compartment drawer slidingly mounted within the compartment housing. The compartment drawer includes an uninterrupted power supply (UPS) and one or more batteries for providing battery powered backup for electronics components mounted in the rack. The UPS includes one or more output power lines that connect to one or more outlets for supplying power to components mounted on the rack. The compartment drawer is mounted to the compartment housing through mating slide rails. The compartment drawer includes an access panel with a handle which permits a user to slide the compartment drawer out from the compartment housing.

The compartment is preferably mounted to the top frame or the base frame.

In an embodiment, the mounted to the base frame and accessible from a top surface of the base frame. In an embodiment, the outlets are mounted within one of the vertical posts.

Preferably the sliding of the compartment drawer relative to the housing causes power supply from the batteries to the UPS to automatically disengage.

In an embodiment, the compartment drawer includes a conductor that connects with a mating conductor on the compartment housing or rack when the compartment drawer is positioned fully within the compartment housing and is disconnected from the mating conductor when the compartment drawer is slid outwards from the housing. In one embodiment the conductor of the compartment drawer is mounted on one of the mating rails and the other conductor is mounted on the mating rail connected to the compartment housing.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

For the purpose of illustrating the invention, the drawings show a form of the invention which is presently preferred. However, it should be understood that this invention is not limited to the precise arrangements and instrumentalities shown in the drawings.

DESCRIPTION OF THE PREFERRED EMBODIMENTS

Figure 1:
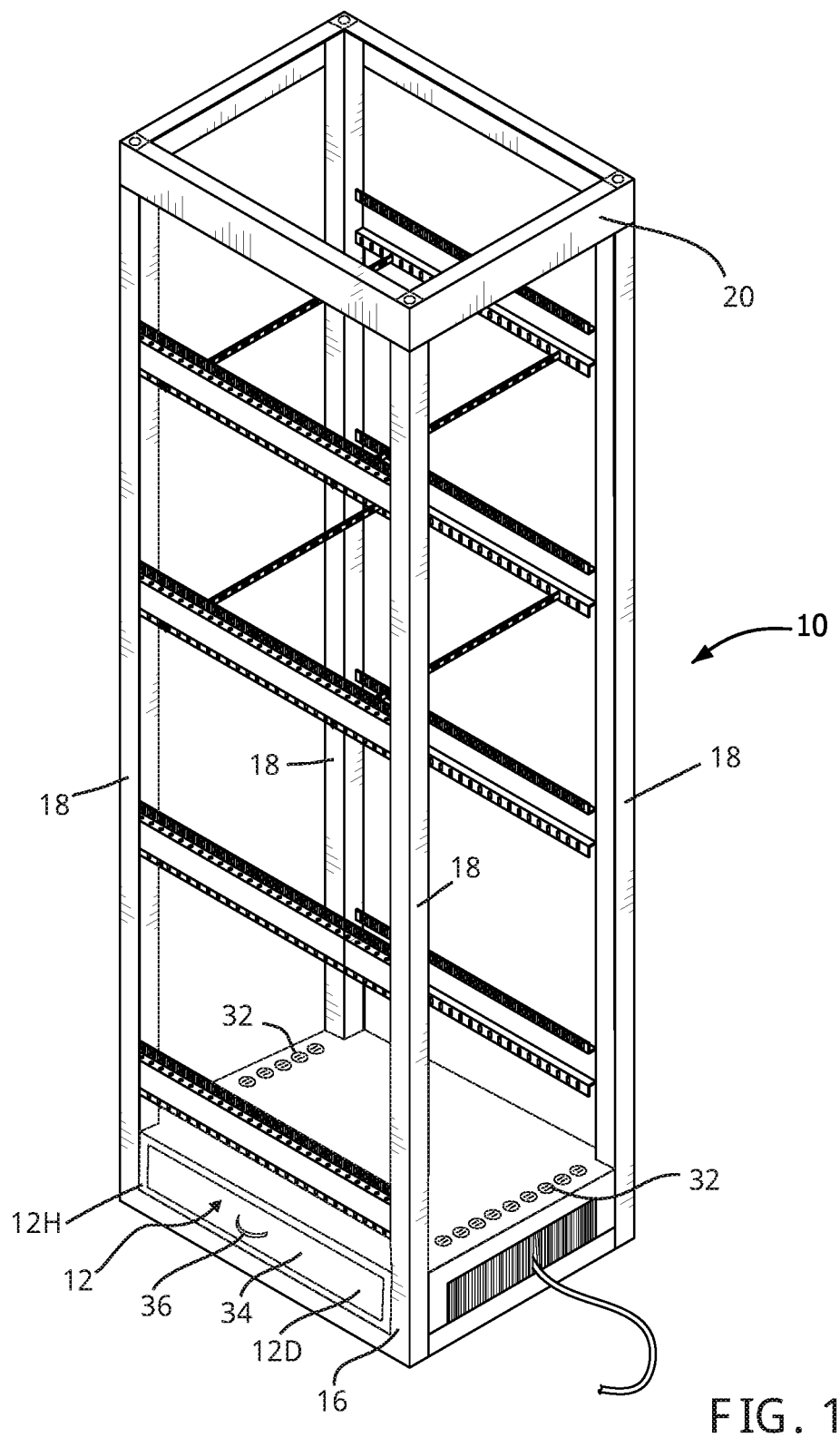
FIG. 1 is a perspective view of an electronics rack according to the present invention.

Referring to the figures, a preferred embodiment is shown of an electronics rack 10 with integrated battery storage compartment 12 for an uninterrupted power supply (UPS) 14. The electronics rack 10 is configured for use in storing electronics components, such as audio/visual equipment or computer servers. The rack 10 includes a base frame 16, at least four vertical posts or rails 18 and a top frame 20. Each end of each vertical rail 18 attaches to the top frame 20 and base frame 16 through a conventional means, such as screws, bolts, welds, or snap together connections.

Figure 2:
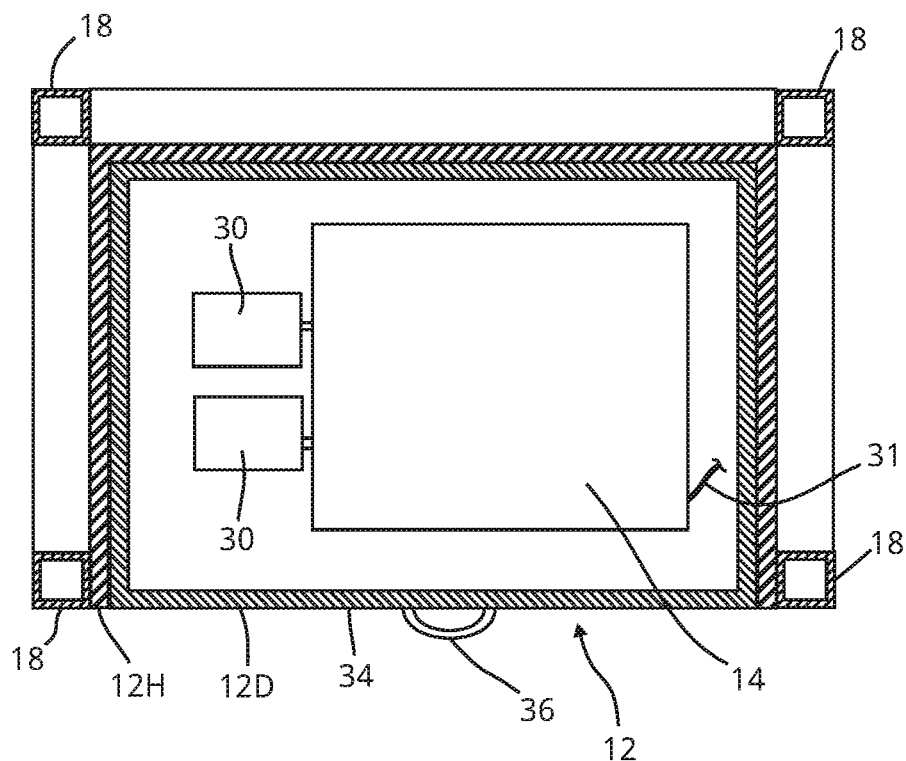
FIG. 2 is a cross-sectional view of the base frame illustrating the battery storage compartment.

The battery storage compartment 12 is mounted under or on top of the frame, or built into the top frame 20 or the base frame 16. The illustrated embodiment shows the battery storage compartment 12 located in the base frame 16 of the rack 10. The battery storage compartment 12 includes a compartment housing 12H and a compartment drawer 12D. The compartment drawer 12D includes an uninterrupted power supply (UPS) 14 (shown in FIG. 2) which is generally conventional. The UPS 14 includes one or more batteries 30 for providing battery powered backup for electronics components mounted in the rack 10. The UPS 14 includes output power lines 31 that connect to one or more outlets 32 that provide connections for components mounted on the rack or a power strip to be attached. Although the outlets are shown on the upper surface of the base frame 16, they could, alternatively, be mounted within one or more of the vertical posts 18 as described in U.S. Pat. No. 10,334,751, titled "Electronics Rack Post With Integrated Power And Data Supply" and assigned to the applicant of the current application. The disclosure of that application is incorporated herein by reference in its entirety. The placement of the outlets in the vertical posts permits the outlets to be located close to the electronic equipment, thus minimizing wiring runs and allowing for easier servicing of equipment.

Figure 3:
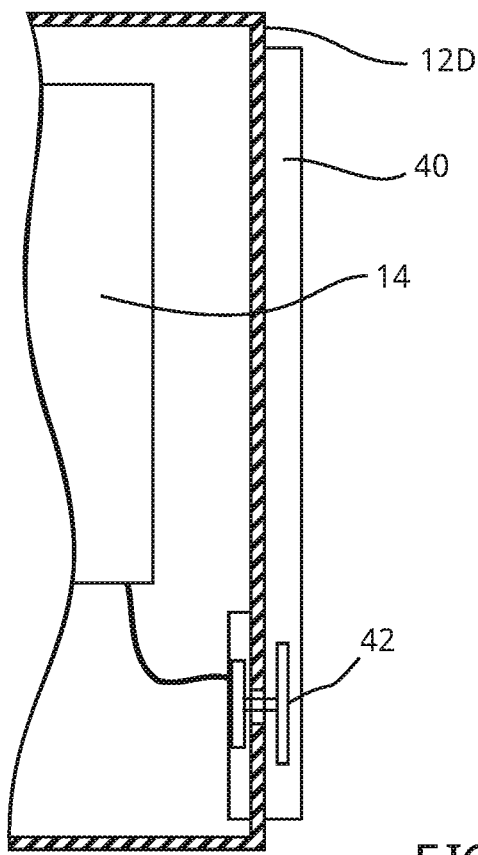
FIG. 3 is a cross-sectional view of a portion of storage compartment drawer removed from the base frame according to an embodiment of the invention.
Figure 4:
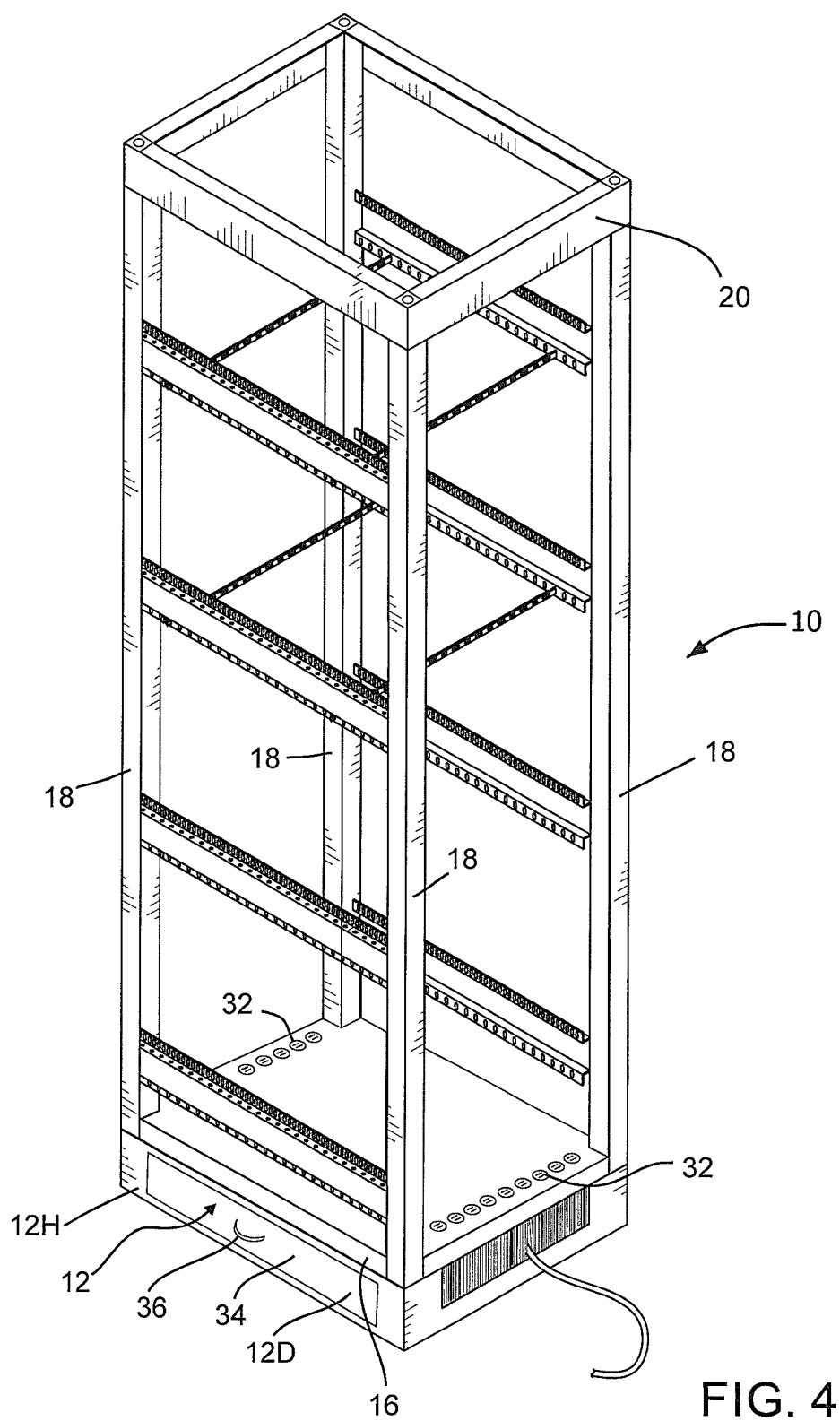
FIG. 4 is a perspective view of another embodiment of an electronics rack according to the present invention.

In order to access the UPS 14 and, in particular, the batteries 30, for purposes of testing and replacement, the drawer 12D is slidingly mounted to the housing 12H through the use of two mating sliding (e.g., telescoping) rails, which are conventional, one component of the sliding rails mounted to the sides of the drawer 12D and the other mounted to an inside wall of the housing 12H. The drawer has an access panel 34 with a handle 36. When servicing the UPS 14, the service personnel pulls the handle 36 of the access panel 34 causing the battery storage drawer 12D, or at least a portion of it, to slide out from under the rack 10. Preferably the sliding of the battery compartment drawer 12D causes the batteries 30 to automatically disengage from the UPS (or to switch off the UPS) so as to remove power from the UPS. For example, the rear or side of the drawer could include a plug that connects with a receptacle on the housing when the compartment 12 is positioned fully within the base frame 16 and is disconnected from the receptacle when the compartment 12 is slip outwards form the base frame 16. The connection of the plug and receptacle controlling a switch when connected that turns the UPS on. Alternatively, the switch for turning the UPS on and off could be controlled by the rails upon which the compartment drawer 12D slides into and out of the compartment housing 12H. For example, referring to FIG. 3, the compartment rail 40 that slidingly engages with a mating rail (not shown) in the inside wall of the housing 12H. A portion of the compartment rail 40 includes a conductor strip 42 that connects to the UPS power in the drawer 12D. A corresponding conductor would be located on the mating rail and configured to contact the conductor strip 42 when the compartment drawer 12D is fully inserted into the housing 12H, thereby completing the circuit and turning the UPS on. When the compartment drawer 12D is slid outwards, the conductor strip 42 will no longer be in contact with the mating conductor, thereby turning the UPS off. However, the present invention contemplates any way of disengaging the power, including manually unplugging a cable assembly connect to the batteries.

While the illustrated embodiment includes a housing 12H that is mounted within the base frame 16, it should be readily understood that the base frame itself may define the housing, or the housing may be separate from and located below the base frame 16.

Although the discussion and drawings illustrate the drawer on the front of the rack, it is contemplated that the drawer may be located on the rear of the rack, or in the top of the rack. For example, as discussed above, U.S. Pat. No. 7,719,835 describes a rack with an assembly of support components, such as fans/cooling systems, power supplies, lighting assemblies, etc. mounted in the top. The present invention could be incorporated into such a system so as to integrate a drawer in the top in which the batteries for the UPS 14 are stored and accessible.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed. The various embodiments and elements can be interchanged or combined in any suitable manner as necessary.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

The invention claimed is:

1. An electronics rack with integrated battery storage compartment for an uninterrupted power supply, the rack comprising:
a base frame;
a top frame;
at least four vertical posts, each end of each vertical post attaching to the top frame and base frame; and
a battery storage compartment including a compartment housing attached to the rack and a compartment drawer slidingly mounted within the compartment housing, the compartment drawer includes an uninterrupted power supply (UPS) and one or more batteries for providing battery powered backup for electronics components mounted in the rack, the UPS including output power lines that connect to one or more outlets for supplying power to components mounted on the rack, wherein the compartment drawer is mounted to the compartment housing through mating slide rails, the compartment drawer including an access panel with a handle which permits a user to slide the compartment drawer out from the compartment housing;
wherein the outlets connect to a power strip; and
wherein the sliding of the compartment drawer relative to the housing causes power supply from the batteries to the UPS to automatically disengage.

2. The rack of claim 1, wherein the compartment is mounted to the top frame.

3. The rack of claim 1, wherein the compartment is mounted below and attached to the base frame.

4. The rack of claim 1, wherein the compartment drawer includes a conductor that connects with a mating conductor on the compartment housing or rack when the compartment drawer is positioned fully within the compartment housing and is disconnected from the mating conductor when the compartment drawer is slid outwards from the housing.

5. The rack of claim 4, wherein the conductor of the compartment drawer is mounted on one of the mating rails and the other conductor is mounted on the mating rail connected to the compartment housing.

6. An electronics rack with integrated battery storage compartment for an uninterrupted power supply, the rack comprising:
a base frame;
a top frame;
at least four vertical posts, each end of each vertical post attaching to the top frame and base frame;
a battery storage compartment including a compartment housing attached to the rack and a compartment drawer slidingly mounted within the compartment housing, the compartment drawer includes an uninterrupted power supply (UPS) and one or more batteries for providing battery powered backup for electronics components mounted in the rack, the UPS including output power lines that connect to one or more outlets for supplying power to components mounted on the rack, wherein the compartment drawer is mounted to the compartment housing through mating slide rails, the compartment drawer including an access panel with a handle which permits a user to slide the compartment drawer out from the compartment housing;
wherein the outlets are mounted to the base frame and accessible from a top surface of the base frame.

7. The rack of claim 6, wherein the sliding of the compartment drawer relative to the housing causes power supply from the batteries to the UPS to automatically disengage.

8. The rack of claim 7, wherein the compartment drawer includes a conductor that connects with a mating conductor on the compartment housing or rack when the compartment drawer is positioned fully within the compartment housing and is disconnected from the mating conductor when the compartment drawer is slid outwards from the housing.

9. The rack of claim 8, wherein the conductor of the compartment drawer is mounted on one of the mating rails and the other conductor is mounted on the mating rail connected to the compartment housing.

10. An electronics rack with integrated battery storage compartment for an uninterrupted power supply, the rack comprising:
a base frame;
a top frame;
at least four vertical posts, each end of each vertical post attaching to the top frame and base frame;
a battery storage compartment including a compartment housing attached to the rack and a compartment drawer slidingly mounted within the compartment housing, the compartment drawer includes an uninterrupted power supply (UPS) and one or more batteries for providing battery powered backup for electronics components mounted in the rack, the UPS including output power lines that connect to one or more outlets for supplying power to components mounted on the rack, wherein the compartment drawer is mounted to the compartment housing through mating slide rails, the compartment drawer including an access panel with a handle which permits a user to slide the compartment drawer out from the compartment housing;
wherein the outlets are mounted within one of the vertical posts; and
wherein the sliding of the compartment drawer relative to the housing causes power supply from the batteries to the UPS to automatically disengage.

11. The rack of claim 10, wherein the compartment drawer includes a conductor that connects with a mating conductor on the compartment housing or rack when the compartment drawer is positioned fully within the compartment housing and is disconnected from the mating conductor when the compartment drawer is slid outwards from the housing.

12. The rack of claim 11, wherein the conductor of the compartment drawer is mounted on one of the mating rails and the other conductor is mounted on the mating rail connected to the compartment housing.

13. An electronics rack with integrated battery storage compartment for an uninterrupted power supply, the rack comprising:
a base frame;
a top frame;
at least four vertical posts, each end of each vertical post attaching to the top frame and base frame;
a battery storage compartment including a compartment housing attached to the rack and a compartment drawer slidingly mounted within the compartment housing, the compartment drawer includes an uninterrupted power supply (UPS) and one or more batteries for providing battery powered backup for electronics components mounted in the rack, the UPS including output power lines that connect to one or more outlets for supplying power to components mounted on the rack, wherein the compartment drawer is mounted to the compartment housing through mating slide rails, the compartment drawer including an access panel with a handle which permits a user to slide the compartment drawer out from the compartment housing;

wherein the sliding of the compartment drawer relative to the housing causes power supply from the batteries to the UPS to automatically disengage.

14. The rack of claim 13, wherein the compartment drawer includes a conductor that connects with a mating conductor on the compartment housing or rack when the compartment drawer is positioned fully within the compartment housing and is disconnected from the mating conductor when the compartment drawer is slid outwards from the housing.

15. The rack of claim 14, wherein the conductor of the compartment drawer is mounted on one of the mating rails and the other conductor is mounted on the mating rail connected to the compartment housing.

* * * * *